(12) United States Patent
Oka

(10) Patent No.: US 6,928,129 B2
(45) Date of Patent: Aug. 9, 2005

(54) PHASE LOCKED LOOP CIRCUIT AND METHOD OF FREQUENCY MODULATION IN PHASE LOCKED LOOP CIRCUIT

(75) Inventor: Yoshitaka Oka, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 869 days.

(21) Appl. No.: 09/797,990

(22) Filed: Mar. 5, 2001

(65) Prior Publication Data

US 2001/0036239 A1 Nov. 1, 2001

(30) Foreign Application Priority Data

Mar. 3, 2000 (JP) ........................................ 2000-059646

(51) Int. Cl.[7] .............................................. H03D 3/24
(52) U.S. Cl. ........................................................ 375/376
(58) Field of Search ................................ 375/375, 373, 375/374, 376; 370/516; 327/146, 147, 148, 150–151, 155, 156, 157, 159, 160

(56) References Cited

U.S. PATENT DOCUMENTS

| | | | | |
|---|---|---|---|---|
| 5,257,294 A | * | 10/1993 | Pinto et al. ................. | 375/376 |
| 5,604,773 A | * | 2/1997 | Urala ........................ | 375/372 |
| 6,049,254 A | * | 4/2000 | Knapp et al. ................. | 331/16 |
| 6,225,840 B1 | * | 5/2001 | Ishimi ........................ | 327/116 |
| 6,404,249 B2 | * | 6/2002 | Hayashida ................... | 327/159 |
| 6,496,556 B1 | * | 12/2002 | Huehne et al. ................ | 377/2 |

* cited by examiner

Primary Examiner—Tesfaldet Bocure
Assistant Examiner—Khanh Tran
(74) Attorney, Agent, or Firm—Young & Thompson

(57) ABSTRACT

The present invention provides a phase locked loop circuit comprising: a frequency divider for frequency-diving an output signal to generate frequency-divided pulses; an oscillator for generating the output signal under control to an oscillation frequency by a control voltage obtained from a signal corresponding to a phase difference between the frequency-divided pulses and a reference frequency signal; and a controller for performing such a control that plural kinds of frequency dividing rate are switched to be given to the frequency divider for every time period having a predetermined number of the frequency divided pulses, and at a boundary of switching the plural kinds of frequency dividing rate, the plural kinds of frequency dividing rate are given co-existentially to the frequency divider, and further for switching the coexistent plural kinds of the frequency-dividing rate, the next frequency dividing rate is given before a first appearance of a frequency peak in a transitional characteristic of the frequency of the clock signal outputted from the phase locked loop circuit caused by previous setting the frequency-dividing rate.

8 Claims, 11 Drawing Sheets

PHASE LOCKED LOOP CIRCUIT AND METHOD OF FREQUENCY MODULATION IN PHASE LOCKED LOOP CIRCUIT

BACKGROUND OF THE INVENTION

The present invention relates to a phase locked loop circuit having a frequency modulation function and a method of frequency modulation in phase locked loop circuit.

A phase locked loop circuit has widely been used for generating a clock signal for operations of digital devices in synchronizing with a stable reference frequency input.

The frequency of the clock signal generated from the phase locked loop circuit is normally constant- The phase locked loop circuit generates the clock signal of the constant frequency, whereby an electro-magnetic interference is also caused. Such the electro-magnetic interference may be reduced by a frequency modulation to the frequency of the clock generator. A triangle waveform modulation is effective, wherein a linear variation in frequency is periodically made.

FIG. 1 is a block diagram illustrative of a first conventional phase locked loop circuit having a first conventional frequency modulation function FIG. 2 is a diagram illustrative of a frequency variation of an output clock signal over time of the first conventional phase locked loop circuit of FIG. 1. The first conventional phase locked loop circuit comprises a phase comparator (PFD) 101, a charge pump circuit (CP) 102, a low pass filer (LPF) 103, a voltage control oscillator (VCO) 104, a loop counter 105, a read only memory table 106, and an up-down counter 107.

The voltage control oscillator (VCO) 104 outputs a clock signal which varies in frequency "fo" in response to a controlled voltage from the low pass filter 103. The loop counter 105 counts pulses of the clock signal, and when a counted value reaches a given value corresponding to a frequency dividing rate given by the ROM table 106, then the frequency-dividing pulse of a frequency "fb" is outputted. The phase comparator 101 compares, in frequency, the input of the reference frequency "fr" to the frequency-divided pulse. The charge pump circuit 102 generates a positive or negative current in accordance with the direct current output from the phase comparator 101 for charging or discharging a non-illustrative capacitor of the low pass filter 103. The low pass filter 103 generates the control voltage having a voltage level corresponding to a difference between the reference frequency "fr" and the frequency "fb" of the frequency-dividing pulse, so that the control voltage is supplied to the voltage control oscillator 104. Under such the loop feedback control, the oscillation frequency is controlled by the voltage control oscillator 104, so that the frequency of the output clock signal follows the reference frequency at a predetermined relationship.

The up-down counter 107 up-counts or down-counts the frequency-dividing pulse from the loop counter 105. The ROM table 106 reads out the values of the frequency-dividing rates previously stored in accordance with the address corresponding to the counted value by the up-down counter 107 so as to supply the read out values to the loop counter 105.

The frequency-dividing rate is sequentially increased upon the up-count whereby the output clock frequency "fo" is risen. The frequency-dividing rate is sequentially decreased upon the down-count whereby the output clock frequency "fo" is fallen. The frequency-dividing values are stored in the ROM in the order of the addresses of the ROM table 106 so that the up-count and the down-count are alternatively made in the order of the address of the ROM table 106. The frequency of the output clock signal is alternatively risen and fallen. As a result, the frequency-modulated lock signal is thus generated. In this case, a relationship between the frequency-dividing values and the address stored in the ROM table 106 is adjusted to generate the frequency-modulated clock signal in the triangle waveform as shown in FIG. 2.

The first conventional phase locked loop circuit having the conventional frequency modulation function includes the ROM, for which reason the necessary chip size for accommodating the circuit is large. It is, therefore, required to provide a phase locked loop circuit capable of generating a frequency-modulated clock signal, wherein the predetermined control values are externally inputted for programmable operations without using the ROM.

FIG. 3 is a block diagram illustrative of a second conventional phase locked loop circuit having a second conventional frequency modulation function. FIG. 4 is a view illustrative of a control to frequency-dividing rate of loop counter in the second conventional phase locked loop circuit of FIG. 3. FIG. 5 is a diagram illustrative of variation in frequency of the clock signal over time when the frequency-dividing rate is changed in the second conventional phase locked loop circuit of FIG. 3. This second conventional phase locked loop circuit is disclosed in Japanese laid-open paten publication No. 11-9876. The second conventional phase locked loop circuit comprises a phase comparator (PFD) 201, a charge pump circuit (CP) 202, a low pass filer (LPF) 203, a voltage control oscillator (VCO) 204, a loop counter 205, an arithmetic circuit 206, a control signal generator circuit 207, and a multiplexer 208.

The loop counter 205 counts pulses of the clock signal, and when a counted value reaches a given value corresponding to a frequency dividing rate N0 or N1 given by the multiplexer 208, then the frequency-dividing pulse Nout is outputted. The phase comparator 201 compares, in frequency, the input of the reference frequency "fr" to the frequency-divided pulse. The charge pump circuit 202 generates a positive or negative current in accordance with the direct current output from the phase comparator 201 for charging or discharging a non-illustrative capacitor of the low pass filter 203. The low pass filter 203 generates the control voltage having a voltage level corresponding to a difference between the reference frequency "fr" and the frequency "fb" of the frequency-dividing pulse, so that the control voltage is supplied to the voltage control oscillator 204. Under such the loop feedback control, the oscillation frequency is controlled by the voltage control oscillator 204, so that the frequency of the output clock signal follows the reference frequency at a predetermined relationship.

The arithmetic circuit 206 operates the integer number "V" based on the externally given signals "M" and "D" and outputs the integer number "V". The control signal generator circuit 207 generates a control signal "PS" for controlling the switching operation of the multiplexer 208 with reference to the reference frequency "fr" based on the signal "M" and the integer number "V". The multiplexer 208 switches the frequency dividing rates N0 and N1 in accordance with the control signal "PS" in order to output the switched frequency dividing rate to the loop counter 205. The signal "M" is such a signal that the number of the frequency-divided pulses in one modulation time period of the clock signal generated from the phase locked loop circuit is "aM", wherein "a" is the positive even number, for example, 4. The signal "D" is a modulation scaling signal which decides a difference of the maximum frequency and the minimum frequency of the frequency-modulated clock signal.

The conventional method of controlling the frequency-dividing rate of the loop counter will be described with reference to FIG. 4. There are two frequency-dividing rates N0 and N1 to be given to the loop counter 205, for example, N0<N1. The frequency-dividing rate N0 corresponds to "0" of the control signal PS. The frequency-dividing rate N1 corresponds to "1" of the control signal PS. One of the two frequency-dividing rates N0 and N1 is given to the loop counter 205. If the integer number "V" is 0, then in the first time period T1, the control signal "PS" remains 0, and then the control signal "PS" is changed from 0 to 1 at a boundary between the first and second time periods T1 and T2 before in the second time period T2, the control signal "PS" remains 1. After the second time period T2, the control signal "PS" is changed from 1 to 0. The clock frequency "fo" shows step-like change at the starting and terminating points of the first time period T1 and the starting and terminating points of the second time period T2. If the integer number "V" is increased, then the changes between "0" and "1", appear at each point of the starting and terminating points of the first and second time periods T1 and T2, even in the remaining periods except for the starting and terminating points, the control signal "PS" remains "1" or "0".

If the frequency-dividing rate is changed, the frequency of the clock signal generated by the phase locked loop circuit is changed to follow to a transition property which mainly depends on the characteristics of the charge pump circuit 202 and the low pass filter 203 and the gain of the voltage control oscillator 204.

For example, as shown in FIG. 5, if at a time "t1", the control signal "PS" is changed from "0" to "1", then the clock signal frequency is changed from a value corresponding to the frequency-dividing rate N0 through a transitional variation to a different value corresponding to the frequency-dividing rate N1 before the control signal "PS" becomes stable in accordance with the lock of the phase locked loop operation.

The variation in the frequency of the clock signal upon change o the frequency-dividing rate appears with a transitional delay. If the frequency dividing rate is changed before the phase of the clock signal changed upon the previous change of the previous is locked at the phase of the reference frequency signal, then the variation in the frequency of the clock signal is smoothed. This smoothing is remarkable as the integer number "V" is large.

The arithmetic circuit 206 generates an optimum integer number "V" in accordance with the values "M" and "D", wherein the value "M" represents the number of the frequency-divided pulse Nout corresponding to one-modulation time period of the clock signal frequency, whilst the value "D" represents the modulation scaling signal which decides the difference between the maximum and minimum values of the clock frequency. The second conventional phase locked loop circuit shown in FIG. 3 is capable of generating the frequency-modulated clock signal, wherein the clock frequency varies in the form of the triangle waveform.

The above Japanese laid-open patent publication does not disclose the circuit configuration of the control circuit necessary for generating the control signal "PS".

In the above circumstances, it had been required to develop a novel a phase locked loop circuit having a frequency modulation function and a method of frequency modulation in phase locked loop circuit free from the above problem.

SUMMARY OF THE INVENTION

Accordingly, it is an object of the present invention to provide a novel a phase locked loop circuit having a frequency modulation function free from the above problems.

It is a further object of the present invention to provide a novel method of frequency modulation in phase locked loop circuit from the above problems.

The first present invention provides a phase locked loop circuit comprising: a frequency divider for frequency-dividing an output signal to generate frequency-divided pulses; an oscillator for generating the output signal under control to an oscillation frequency by a control voltage obtained from a signal corresponding to a phase difference between the frequency-divided pulses and a reference frequency signal; and a controller for performing such a control that plural kinds of frequency dividing rate are switched to be given to the frequency divider for every time period having a predetermined number of the frequency divided pulses, and at a boundary of switching the plural kinds of frequency dividing rate, the plural kinds of frequency dividing rate are given co-existentially to the frequency divider, and further for switching the co-existent plural kinds of the frequency-dividing rate, the next frequency dividing rate is given before a first appearance of a frequency peak in a transitional characteristic of the frequency of the clock signal outputted from the phase locked loop circuit caused by previous setting the frequency-dividing rate.

The second present invention provides a method of a frequency modulation to a phase locked loop circuit comprising the steps of: frequency-dividing an output signal to generate frequency-divided pulses; and generating the output signal under control to an oscillation frequency by a control voltage obtained from a signal corresponding to a phase difference between the frequency-divided pulses and a reference frequency signal, thereby to form a phase locked loop, wherein plural kinds of frequency dividing rate are switched to be given to the frequency divider for every time period having a predetermined number of the frequency divided pulses, and at a boundary of switching the plural kinds of frequency dividing rate, the plural kinds of frequency dividing rate are given co-existentially to the frequency divider, and further for switching the co-existent plural kinds of the frequency-dividing rate, the next frequency dividing rate is given before a first appearance of a frequency peak in a transitional characteristic of the frequency of the clock signal outputted from the phase locked loop caused by previous setting the frequency-dividing rate.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 4 is a view illustrative of a control to frequency-dividing rate of loop counter in the second conventional phase locked loop circuit of FIG. 3.

DISCLOSURE OF THE INVENTION

Figure 1:
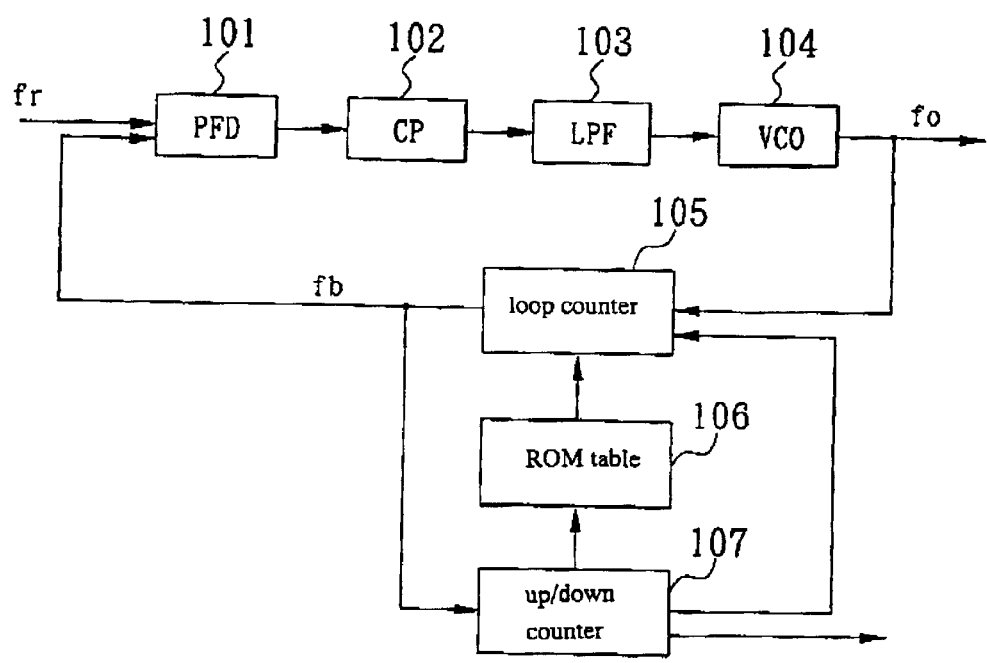
FIG. 1 is a block diagram illustrative of a first conventional phase locked loop circuit having a first conventional frequency modulation function.
Figure 2:
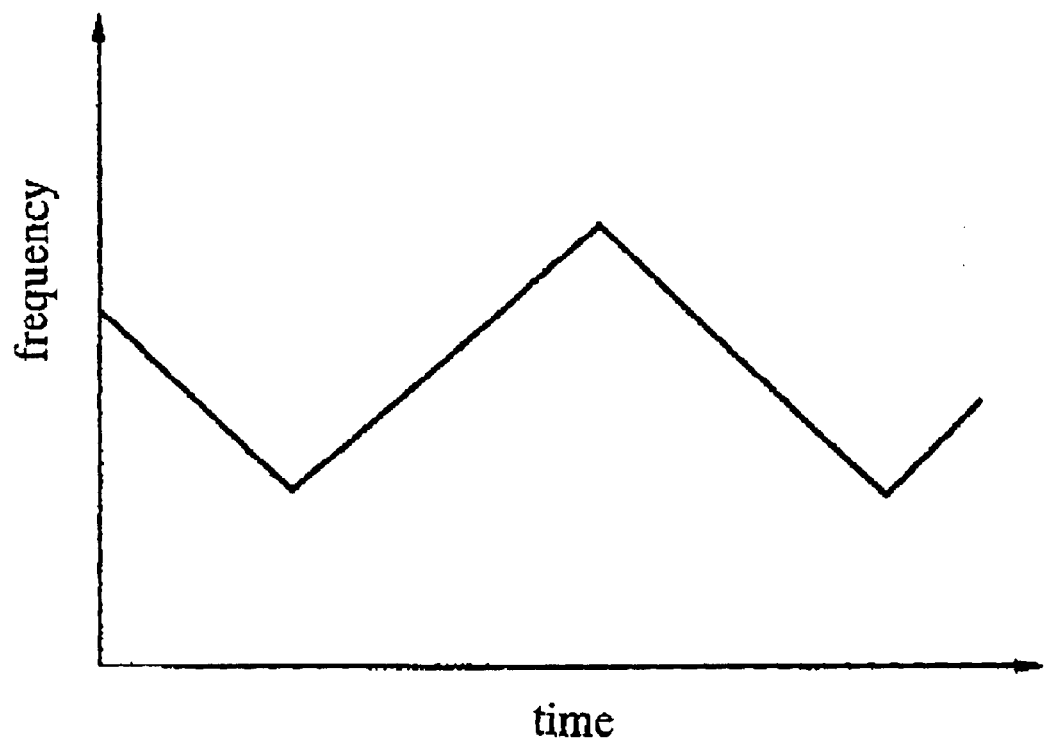
FIG. 2 is a diagram illustrative of a frequency variation of an output clock signal over time of the first conventional phase locked loop circuit of FIG. 1.
Figure 3:
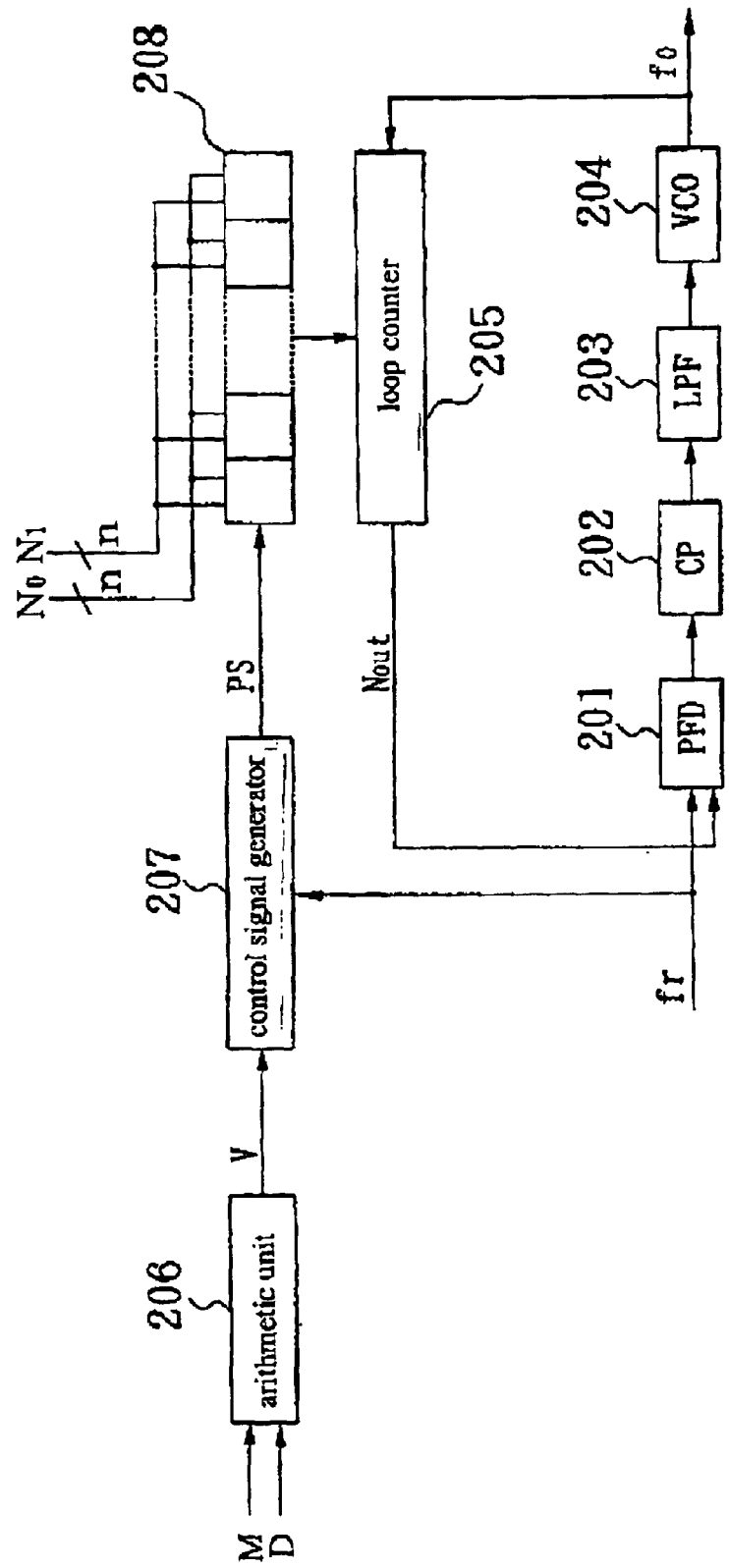
FIG. 3 is a block diagram illustrative of a second conventional phase locked loop circuit having a second conventional frequency modulation function.
Figure 5:
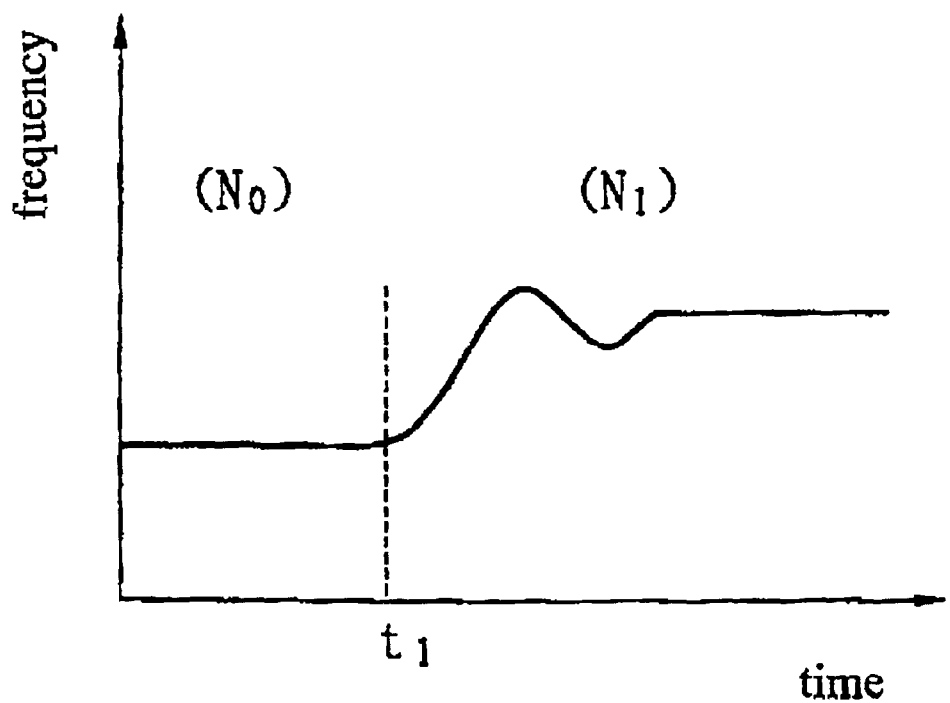
FIG. 5 is a diagram illustrative of variation in frequency of the clock signal over time when the frequency-dividing rate is changed in the second conventional phase locked loop circuit of FIG. 3.

The first present invention provides a phase locked loop circuit comprising: a frequency divider for frequency-dividing an output signal to generate frequency-divided pulses; an oscillator for generating the output signal under control to an oscillation frequency by a control voltage obtained from a signal corresponding to a phase difference between the frequency-divided pulses and a reference frequency signal; and a controller for performing such a control that plural kinds of frequency dividing rate are switched to be given to the frequency divider for every time period having a predetermined number of the frequency divided pulses, and at a boundary of switching the plural kinds of frequency dividing rate, the plural kinds of frequency dividing rate are given co-existentially to the frequency divider, and further for switching the co-existent plural kinds of the frequency-dividing rate, the next frequency dividing rate is given before a first appearance of a frequency peak in a transitional characteristic of the frequency of the clock signal outputted from the phase locked loop circuit caused by previous setting the frequency-dividing rate.

It is preferable that the controller calculates the frequency dividing rate of the frequency divider on the basis of a first signal "I", a second signal "M" and a third signal "V" to generate a frequency dividing rate control signal in accordance with a frequency dividing time period of the output signal and supply the frequency dividing rate control signal to the frequency divider, where the first signal "I" represents a counted value of the frequency-divided pulses, and the second signal "M" represents the number of outputs of the frequency divided pulses corresponding to the frequency dividing time period, and the third signal "V" represents the number of appearance of a combination of first and second frequency dividing rates, and where the first frequency dividing rate is allocated to a first half time period of a first time period corresponding to a rising time period or a falling time period of the frequency modulation waveform, and the second frequency dividing rate is allocated to a second half time period of the first time period, and the first and second frequency dividing rates alternately appear for every frequency dividing time periods at a boundary between the first half time period and the second half time period.

It is further preferable that the controller outputs the first frequency dividing rate if $0 \leq I \leq M-1-V$ is satisfied in the first half time period of the first time period, wherein if $0 \leq I \leq M-1-V$ is not satisfied in the first half time period of the first time period, the controller outputs the second frequency dividing rate, provided that M is an even number and both V and I are either one of odd and even numbers, or provided that M is an odd number and V is an odd number and I is an even number, or provided that M is an odd number and V is an even number and I is an odd number, wherein otherwise but in the first half time period of the first time period, the controller outputs the first frequency dividing rate, wherein the controller outputs the second frequency dividing rate if $M+V \leq I$ is satisfied in the second half time period of the first time period, wherein if $M+V \leq I$ is not satisfied in the second half time period of the first time period, the controller outputs the first frequency dividing rate, provided that M is an even number and V is an odd number and I is an even number, or provided that M is an even number and V is an even number and both V and I are either one of even and odd numbers, and wherein otherwise but in the second half time period of the first time period, the controller outputs the second frequency dividing rate.

It is also preferable that the controller has a control output arithmetic unit which calculates the frequency dividing rate of the frequency divider on the basis of a first signal "I", a second signal "M" and a third signal "V" to generate an arithmetic output signal in accordance with a frequency dividing time period of the output signal, where the first signal "I" represents a counted value of the frequency-divided pulses, and the second signal "M" represents the number of outputs of the frequency divided pulses corresponding to the frequency dividing time period, and the third signal "V" represents the number of appearance of a combination of first and second frequency dividing rates, and where the first frequency dividing rate is allocated to a first half time period of a first time period corresponding to first one of a rising time period and a falling time period of the frequency modulation waveform, and the second frequency dividing rate is allocated to a second half time period of the first time period, and the first and second frequency dividing rates alternately appear for every frequency dividing time periods at a boundary between the first half time period and the second half time period, and further wherein the control output arithmetic unit selects the arithmetic output signal in the first time period, and the control output arithmetic unit selects an inverted signal to the arithmetic output signal in a second time period corresponding to second one of the rising time period and the falling time period of the frequency modulation waveform, and the control output arithmetic unit supplies selected one of the arithmetic output signal and the inverted signal to the frequency divider as a frequency dividing rate control signal.

It is further preferable that the control output arithmetic unit outputs the first frequency dividing rate if $0 \leq I \leq M-1-V$ is satisfied in the first half time period of the first time period, wherein if $0 \leq I \leq M-1-V$ is not satisfied in the first half time period of the first time period, the control output arithmetic unit outputs the second frequency dividing rate, provided that M is an even number and both V and I are either one of odd and even numbers, or provided that M is an odd number and V is an odd number and I is an even number, or provided that M is an odd number and V is an even number and I is an odd number, wherein otherwise but in the first half time period of the first time period, the control output arithmetic unit outputs the first frequency dividing rate, wherein the control output arithmetic unit outputs the second frequency dividing rate if M+V≦I is satisfied in the second half time period of the first time period, wherein if M+V≦I is not satisfied in the second half time period of the first time period, the control output arithmetic unit outputs the first frequency dividing rate, provided that M is an even number and V is an odd number and I is an even number, or provided that M is an even number and V is an even number and both V and I are either one of even and odd numbers, and wherein otherwise but in the second half time period of the first time period, the control output arithmetic unit outputs the second frequency dividing rate.

The second present invention provides a method of a frequency modulation to a phase locked loop circuit comprising the steps of: frequency-dividing an output signal to generate frequency-divided pulses; and generating the output signal under control to an oscillation frequency by a control voltage obtained from a signal corresponding to a phase difference between the frequency-divided pulses and a reference frequency signal, thereby to form a phase locked loop, wherein plural kinds of frequency dividing rate are switched to be given to the frequency divider for every time period having a predetermined number of the frequency divided pulses, and at a boundary of switching the plural kinds of frequency dividing rate, the plural kinds of frequency dividing rate are given co-existentially to the frequency divider, and further for switching the co-existent plural kinds of the frequency-dividing rate, the next frequency dividing rate is given before a first appearance of a frequency peak in a transitional characteristic of the frequency of the clock signal outputted from the phase locked loop caused by previous setting the frequency-dividing rate.

It is preferable that the frequency dividing rate of the frequency divider is calculated on the basis of a first signal "I", a second signal "M" and a third signal "V" to generate a frequency dividing rate control signal in accordance with a frequency dividing time period of the output signal, where the first signal "I" represents a counted value of the frequency-divided pulses, and the second signal "M" represents the number of outputs of the frequency divided pulses corresponding to the frequency dividing time period, and the third signal "V" represents the number of appearance of a combination of first and second frequency dividing rates, and where the first frequency dividing rate is allocated to a first half time period of a first time period corresponding to a rising time period or a falling time period of the frequency modulation waveform, and the second frequency dividing rate is allocated to a second half time period of the first time period, and the first and second frequency dividing rates alternately appear for every frequency dividing time periods at a boundary between the first half time period and the second half time period.

It is further preferable that the first frequency dividing rate is outputted if 0≦I≦M−1−V is satisfied in the first half time period of the first time period, wherein if 0≦I≦M−1−V is not satisfied in the first half time period of the first time period, the second frequency dividing rate is outputted, provided that M is an even number and both V and I are either one of odd and even numbers, or provided that M is an odd number and V is an odd number and I is an even number, or provided that M is an odd number and V is an even number and I is an odd number, wherein otherwise but in the first half time period of the first time period, the first frequency dividing rate is outputted, wherein the second frequency dividing rate is outputted if M+V≦I is satisfied in the second half time period of the first time period, wherein if M+V≦I is not satisfied in the second half time period of the first time period, the first frequency dividing rate is outputted, provided that M is an even number and V is an odd number and I is an even number, or provided that M is an even number and V is an even number and both V and I are either one of even and odd numbers, and wherein otherwise but in the second half time period of the first time period, the second frequency dividing rate is outputted.

It is also preferable that the frequency dividing rate is calculated on the basis of a first signal "I", a second signal "M" and a third signal "V" to generate an arithmetic output signal in accordance with a frequency dividing time period of the output signal, where the first signal "I" represents a counted value of the frequency-divided pulses, and the second signal "M" represents the number of outputs of the frequency divided pulses corresponding to the frequency dividing time period, and the third signal "V" represents the number of appearance of a combination of first and second frequency dividing rates, and where the first frequency dividing rate is allocated to a first half time period of a first time period corresponding to first one of a rising time period and a falling time period of the frequency modulation waveform, and the second frequency dividing rate is allocated to a second half time period of the first time period, and the first and second frequency dividing rates alternately appear for every frequency dividing time periods at a boundary between the first half time period and the second half time period, and further wherein the arithmetic output signal is selected in the first time period, and an inverted signal to the arithmetic output signal is selected in a second time period corresponding to second one of the rising time period and the falling time period of the frequency modulation waveform.

It is further preferable that the first frequency dividing rate is outputted if 0≦I≦M−1−V is satisfied in the first half time period of the first time period, wherein if 0≦I≦M−1−V is not satisfied in the first half time period of the first time period, the second frequency dividing rate is outputted, provided that M is an even number and both V and I are either one of odd and even numbers, or provided that M is an odd number and V is an odd number and I is an even number, or provided that M is an odd number and V is an even number and I is an odd number, wherein otherwise but in the first half time period of the first time period, the first frequency dividing rate is outputted, wherein the second frequency dividing rate is outputted if M+V≦I is satisfied in the second half time period of the first time period, wherein if M+V≦I is not satisfied in the second half time period of the first time period, the first frequency dividing rate is outputted, provided that M is an even number and V is an odd number and I is an even number, or provided that M is an even number and V is an even number and both V and I are either one of even and odd numbers, and wherein otherwise but in the second half time period of the first time period, the second frequency dividing rate is outputted.

Preferred Embodiment

Figure 6:
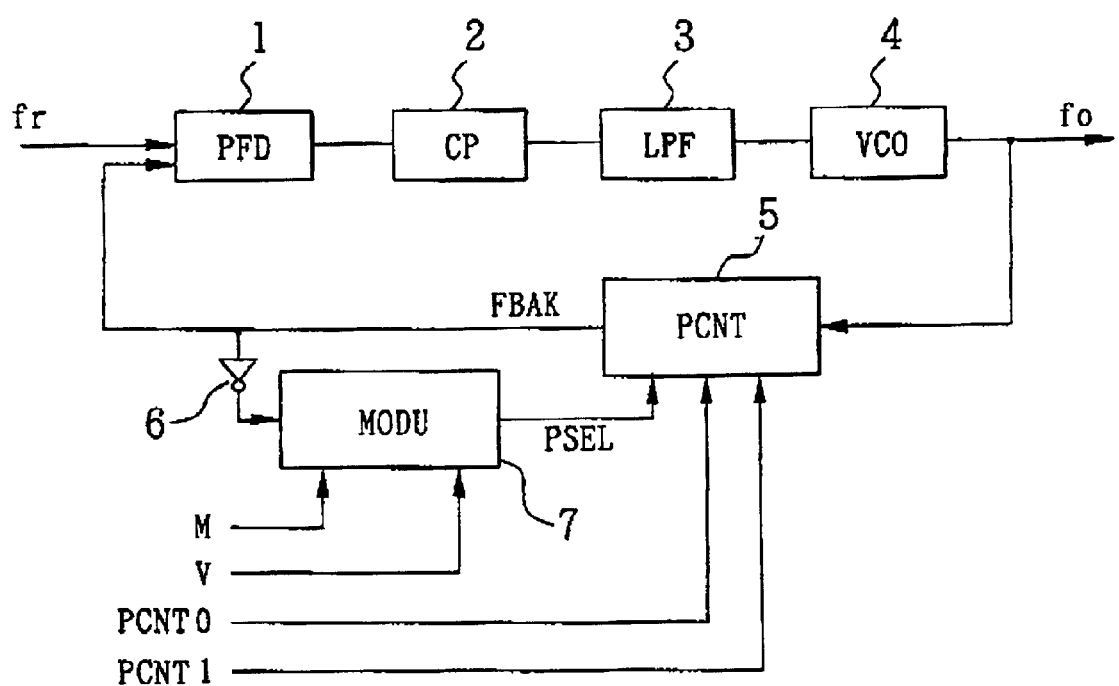
FIG. 6 is a block diagram illustrative of a first novel phase locked loop circuit having a first novel frequency modulation function in a first embodiment in accordance with the present invention.
Figure 7:
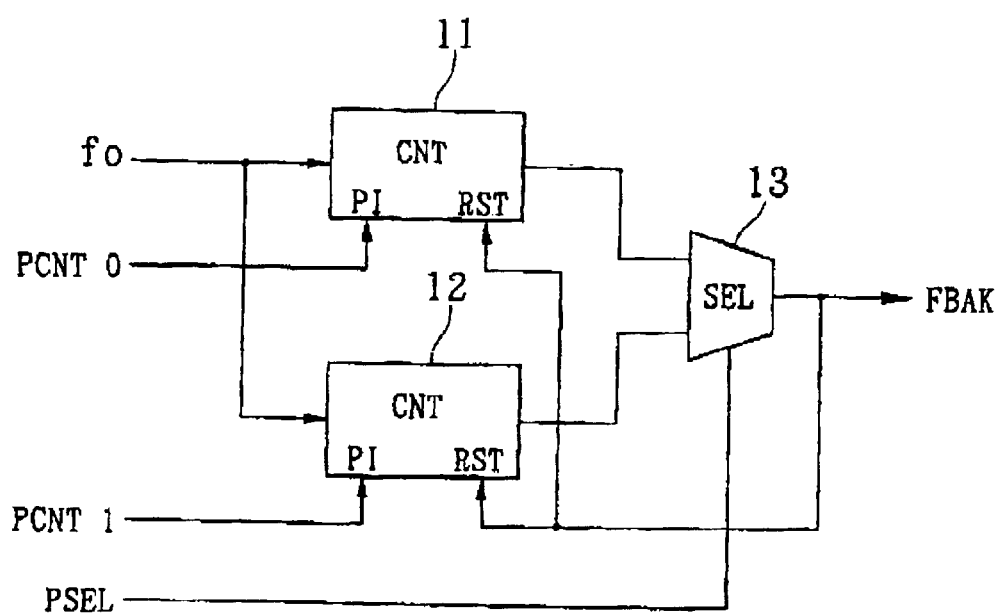
FIG. 7 is a block diagram illustrative of a circuit configuration of a loop counter of the first novel phase locked loop circuit of FIG. 6 in a first embodiment in accordance with the present invention.
Figure 8:
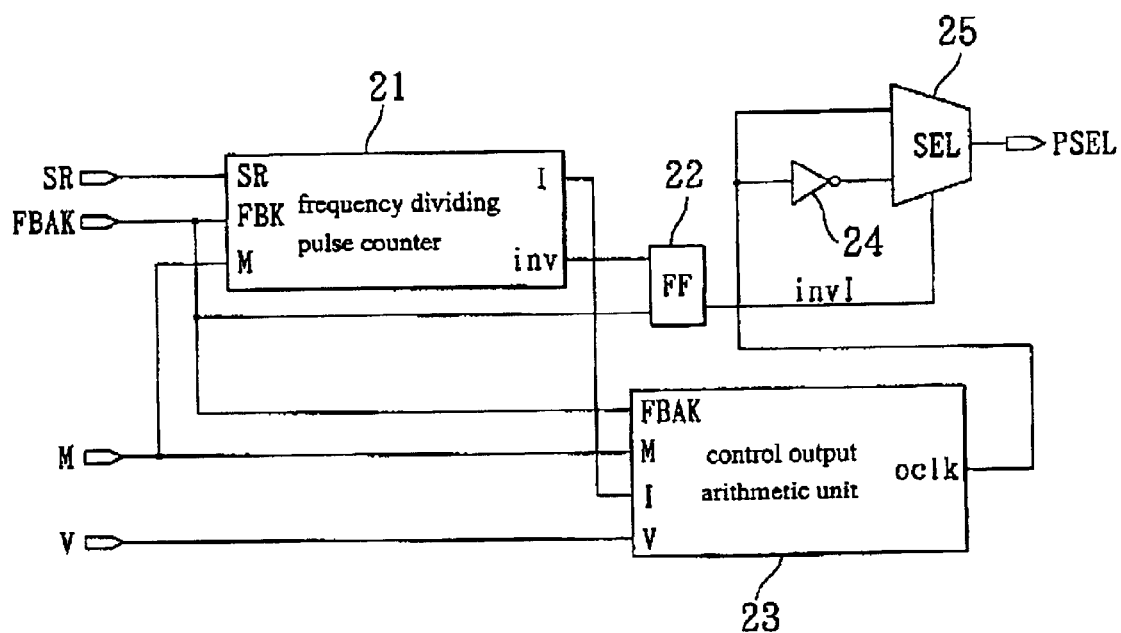
FIG. 8 is a block diagram illustrative of a circuit configuration of a control signal generator of the first novel phase locked loop circuit of FIG. 6 in a first embodiment in accordance with the present invention.
Figure 9:
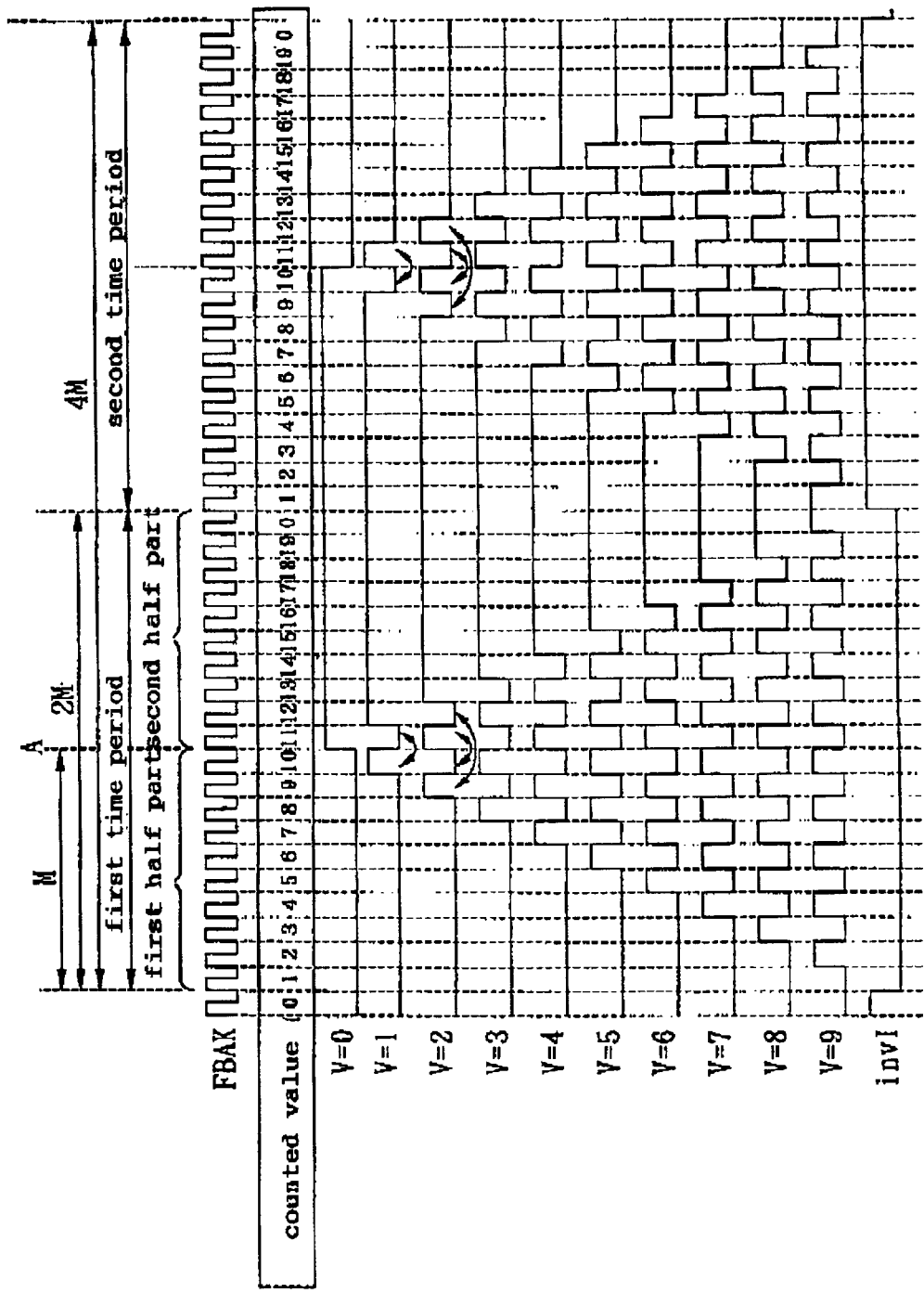
FIG. 9 is a timing chart illustrative of operations of the first novel phase locked loop circuit of FIG. 6 in a first embodiment in accordance with the present invention.
Figure 10:
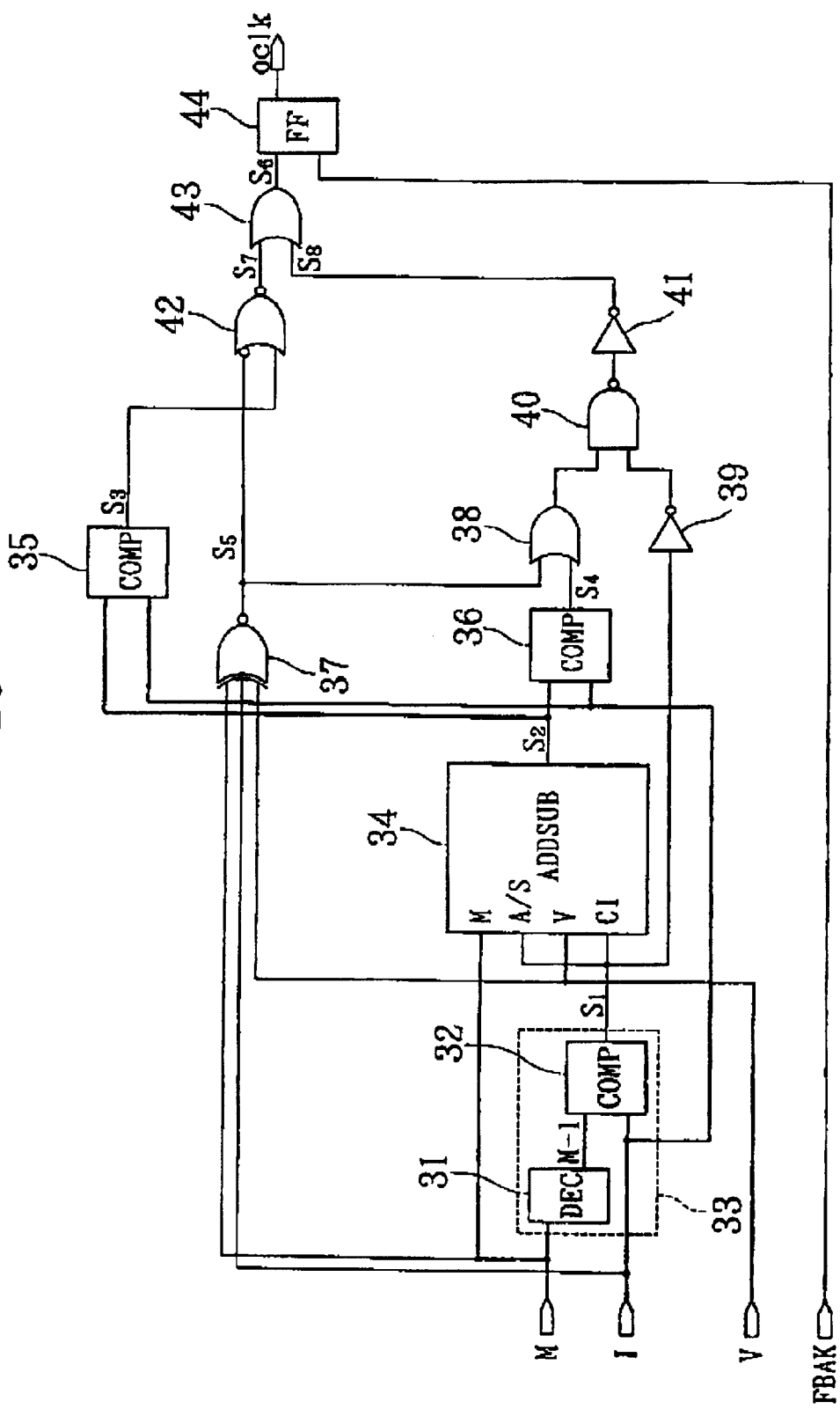
FIG. 10 is a block diagram illustrative of a circuit configuration of a control output arithmetic unit of the first novel phase locked loop circuit of FIG. 6 in a first embodiment in accordance with the present invention.
Figure 11:
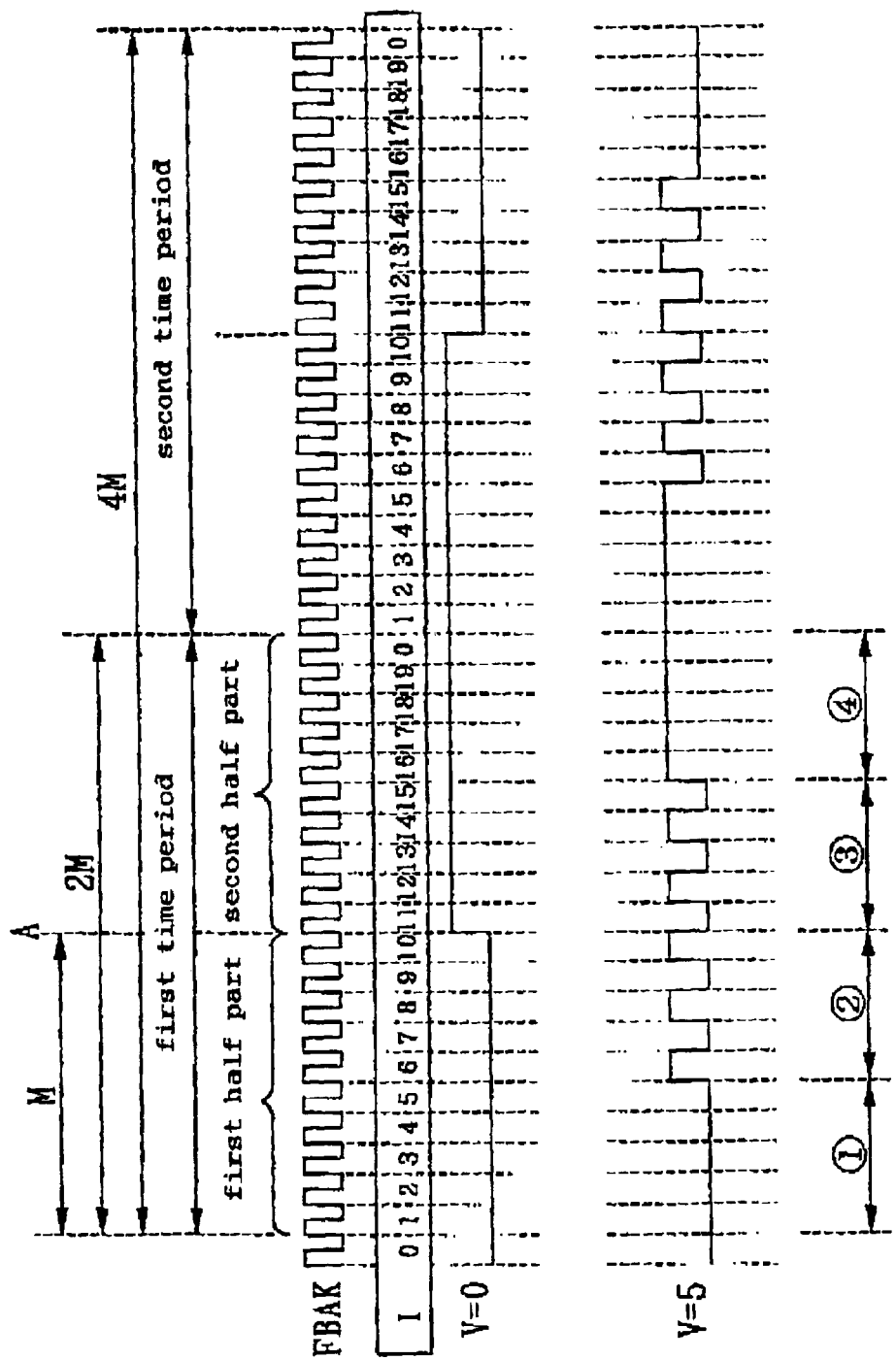
FIG. 11 is a timing chart illustrative of operations of the control output arithmetic unit of FIG. 10 in a first embodiment in accordance with the present invention.

A first embodiment according to the present invention will be described in detail with reference to the drawings. FIG. 6 is a block diagram illustrative of a first novel phase locked loop circuit having a first novel frequency modulation function in a first embodiment in accordance with the present invention. FIG. 7 is a block diagram illustrative of a circuit configuration of a loop counter of the first novel phase locked loop circuit of FIG. 6 in a first embodiment in accordance with the present invention. FIG. 8 is a block diagram illustrative of a circuit configuration of a control signal generator of the first novel phase locked loop circuit of FIG. 6 in a first embodiment in accordance with the present invention. FIG. 9 is a timing chart illustrative of operations of the first novel phase locked loop circuit of FIG. 6 in a first embodiment in accordance with the present invention. FIG. 10 is a block diagram illustrative of a circuit configuration of a control output arithmetic unit of the first novel phase locked loop circuit of FIG. 6 in a first embodiment in accordance with the present invention. FIG. 11 is a timing chart illustrative of operations of the control output arithmetic unit of FIG. 10 in a first embodiment in accordance with the present invention.

The first novel phase locked loop circuit comprises a phase comparator (PFD) 1, a charge pump circuit (CP) 2, a low pass filter (LPF) 3, a voltage control oscillator (VCO) 4, a loop counter (PCNT) 5, an inverter 6, and a control signal generator (MODU) 7. The loop counter 5 functions as a frequency divider.

The phase comparator (PFD) 1 compares a phase of an inputted reference frequency "fr" and a phase of a frequency-divided pulse FBAK from the loop counter 5 to generate a direct current output having a magnitude polarity corresponding to a difference in phase between the reference frequency "fr" and the frequency-divided pulse FBAK. The charge pump circuit 2 outputs a positive or negative current in accordance with the direct current output from the phase comparator 1. The low pass filter 3 has a non-illustrated capacitor to be charged and discharged by the current from the charge pump circuit 2, so that the low pass filter 3 generates a control voltage having a voltage level corresponding to the difference between the reference frequency "fr" and the output frequency of the frequency-divided pulse FBAK. The voltage control oscillator 4 outputs a clock signal which varies in frequency "fo" in response to the control voltage from the low pass filter 3.

The loop counter 5 selects one of first and second counters CNT 11 and CNT 12 in accordance with "0" or "1" of a frequency-divided rate control signal PSEL (hereinafter referred to as a control signal) from the control signal generator 7. The loop counter 5 counts corresponding one of PCNT0 and PCNT1 to the frequency-dividing rate by use of the pulses of the clock signals in accordance with the frequency "fo". The loop counter 5 outputs a carry signal of the counted value as the frequency-divided pulse FBAK and also resets the counters CNT11 and CNT12.

The inverter 6 inverts the frequency-divided pulse FBAK and supply the inverted frequency-divided pulse to the control signal generator 7. The control signal generator 7 outputs a control signal PSEL in accordance with externally inputted signals "M", "V" and "I", wherein the signal "M" represents the number of the frequency-divided pulse FBAK outputted in one quarter of the modulation time period, the signal "V" represents the cyclic number of the changes between "1" and "0" of the control signal PSEL appearing at a boundary between a first half time period and a second half time period of a rising time period of the modulation waveform, and the signal "I" represents an internally counted value of the frequency-divided pulse FBAK.

As shown in FIG. 7, the loop counter 2 comprises first and second programmable counters (CNT) 11 and 12 and a selector (SEL) 13. The first and second programmable counters 11 and 12 are re-set for every frequency-divided pulses FBAK. When each of the first and second programmable counters 11 and 12 counts the output clocks of the frequency "fo" and the counted value reaches the number corresponding to the frequency-dividing rate PCNT0 or PCNT1 given to the frequency-dividing input "PI" externally, then the first and second programmable counters 11 and 12 output the pulse. The selector 13 selects one of the first and second outputs from the first and second programmable counters 11 and 12 in accordance with "0" or "1" of the control signal PSEL, before the selector 13 outputs the selected one of the first and second outputs as the frequency-divided pulse PBAK.

The control signal generator 7 comprises a frequency-dividing pulse counter 21, a flip-flop (FF) 22, a control output arithmetic unit 23, an inverter 24 and a selector (SEL) 25.

The frequency-dividing pulse counter 21 counts falling edges of the frequency-dividing pulse FBAK in a time period "2M" corresponding to a half time period of the modulation waveform, so that the frequency-dividing pulse counter 21 outputs the counted value "I" followed by a self-reset to the frequency-dividing pulse counter 21 and concurrent output of an inversion signal "inv". The frequency-dividing pulse counter 21 is re-set into the initial state or the counted value "0" upon receipt of a system reset signal "SR".

The flip flop 22 inverts "0" state and "1" state every time upon inputs of the inversion signal "inv", so that the flip flop 22 outputs an inverting signal "invI" alternatively inverted between "0" and "1" for every time periods "2M". The control output arithmetic unit 23 operates an output value depending upon the individual levels of the signals "M", "V"and "I" for very outputs of the frequency-divided pulses FBAK, wherein the output value becomes "0" in correspondence with the first frequency-dividing rate PCNT0 and also becomes "1" in correspondence with the second frequency-dividing rate PCNT1. The output values are outputted from the control output arithmetic unit 23 as a signal "oclk". The inverter 24 inverts the signal "oclk" and outputs the inverted signal to the signal "oclk". The selector 25 selects one of the signal "oclk" from the control output arithmetic unit 23 and the inverted signal to the signal "oclk" from the inverter 24, so that the selector 25 outputs the selected one of the signal "oclk" and the inverted signal as the control signal PSEL.

Operations of he first novel phase locked loop circuit will subsequently be described with reference to FIGS. 6, 7, 8 and 9. FIG. 9 illustrates variations between "1" and "0" of the control signal PSEL outputted from the control signal generator 7 in one modulation time period when the signal "M" is 10. In this example, the number of the frequency-divided pulses FBAK in the one modulation time period of the clock signal is 4M. The number of the control signals PSEL in this time period is also 4M. PCNT0 or PCNT1 is given as a frequency dividing rate to the loop counter 5 in accordance with "0" or "1" of the control signal PSEL. The following descriptions will be made assuming that PCNT0 is lower than PCNT1, even it is possible that PCNT0 is higher than PCNT1.

If the signal "V" is "0", in the first half time period of the first time period of the modulation waveform, the control signal generator 7 continuously generates "0" as the control signal PSEL, whereby the clock frequency "fo" is low, and further in the second half time period of the first time period of the modulation waveform, the control signal generator 7 continuously generates "1" as the control signal PSEL, whereby the clock frequency "fo" is high. As the signal "V" is increased, the control signal generator 7 generates the control signal PSEL so that the number of the continuing value "10" is increased, which is be inserted into the boundary between the first half time period and the second half time period of the first time period as the rising time period, In the second time period of the modulation waveform, the waveform is inverted from that in the first time period, for which reason the following descriptions will focus on the first time period only.

In FIG. 9, in case of the signal "V" of "0", in the first half time period (a), the control signal PSEL remains "0". In the second half time period (b), the control signal PSEL remains "1". The clock frequency "fo" controlled by the control signal PSEL shows a step-like change from the low value to the high value at an intermediate point of the first time period as the rising time period of the modulation waveform, wherein the intermediate point corresponds to the boundary between the first half time period (a) and the second half time period (b).

As the signal "V" is increased, the same number of the continuing values "10" as the value of the signal "V" is inserted into the boundary between the first half time period (a) and the second half time period (b). The control is so made that an intermediate point of the total number of the inserted "1" and "0" corresponds to a center point "A" of "2M" in the first time period.

If the frequency-dividing rate is changed, the frequency of the clock signal generated by the phase locked loop circuit is changed mainly depending upon the transitional characteristic which depends both upon the characteristics of the charge pump circuit 2 and the low pass filter 3 and upon the gain of the voltage control oscillator 4. The variation in frequency of the clock signal upon the change of the frequency-dividing rate appears with a transitional delay. If the change between "0" and "1" of the control signal PESL appears so that the next change of the frequency-dividing rate is made before the transitional change in frequency of the clock signal caused by the change of the previous change of the frequency-dividing rate is terminated, then the variation in the frequency of the clock signal is smoothed by the integral effect. The effect is remarkable if the switches are made to the two kinds of the frequency-dividing rates so that the frequency-dividing rates are changed before the first appearing peak in the transitional variation in the frequency of the clock signal. The value of the signal "V" is selected to set the frequency of the change to the frequency-dividing rate made in the one modulation timer period, and the two kinds of the frequency-divided rate are determined so that frequency of the frequency divided pulses are proper value for the transitional characteristics, whereby the frequency of the clock signal shows the linear variation in the form of the triangle waveform. This is common to the second time period corresponding to falling of the modulation waveform. In order to emphasize this effect, it is preferable that the transitional characteristics of the phase locked loop circuit is gentle and the locking time period is long and the band width is wide.

The frequency modulation in the form of the triangle waveform to the frequency "fo" of the clock signal generated from the phase locked loop circuit is realized by that the control output arithmetic unit 23 generats the arithmetic output signal "oclk" in accordance with the following algorithm "A" in the first half part (a) of the time period "2M" and in accordance with the following algorithm "B" in the second half part (b) of the time period "2M".

Algorithm "A":
(1) "0" in a time period of satisfying ($0 \leq I \leq M-1-V$)
(2) "1" in a time period of not satisfying ($0 \leq I \leq M-1-V$), provided that M is the even number, and further both V and I are either even numbers or odd numbers, or provided that M is the odd number, and further V is the odd number and I is the even number, or provided that M is the odd number, and further V is the even number and I is the odd number, and otherwise "0".

Algorithm "B":
(1) "1" in a time period of satisfying ($M+V \leq I$)
(2) "0" in a time period of not satisfying ($M+V \leq I$), provided that M is the even number, and further V is the odd number and I is the even number, or provided that M is the even number, and further V is the even number and I is the odd number, or provided that M is the odd number, and further both V and I are either even numbers or odd numbers, and otherwise "1".

The control output arithmetic unit 23 comprises a first-half-second-half judging unit 33 further comprising a subtracter (DEC) 31 and a first comparator (COMP) 32, a boundary judging unit 34, a second comparator 35, a third comparator 36, an exclusive nor gate (EX-NOR) 37, an OR-gate 38, an inverter 39, a NAND gate 40, an inverter 41, a NOR gate 42, an OR gate 43 and a flip-flop (FF) 44.

The subtracter 31 conducts an operation (M−1) which provides a decrement to the signal "M". The first comparator 32 compares the output signal from the subtracter 31 and the signal "I". The first-half-second-half judging unit 33 outputs "1" as the signal S1 if $0 \leq I \leq M-1$ (the first half) and also outputs "0" if $M \leq I \leq 2M-1$ (the second half). The boundary judging unit 34 performs the subtraction operation and outputs (M−1−V) as the signal S2 if the signal S1 is "1" (the first half), wherein "1" is given to the carry input "CI" and the subtraction (−1) is conducted, and outputs (M+V) as the signal S2 if the signal S1 is "0" (the second half). (M−1−V) and (M+V) respectively correspond to boundaries of the initiating and terminating regions for variation between "0" and "1" of the control signal PSEL in accordance with the algorithms "A" and "B".

The second comparator 35 compares the output signal (M−1−V) from the boundary judging unit 34 to the signal "I" to output "1" as the signal S3 if ($I \leq M-1-V$) and output "0" otherwise. The third comparator 36 compares the output signal S2 from the boundary judging unit 34 to the signal "I" to output "0" as the signal S4 if ($I \leq M+V$) and output "1" otherwise. The EX-NOR gate 37 compares least significant bits "1" or "0" of the signals "M", "I" and "V" to output "1" as the signal S5 if the number of "1" is the even number and output "0" if the number of "1" is the odd number.

The logic circuit comprises the OR-gate 38, the inverter 39, the NAND gate 40, the inverter 41, the NOR gate 42, and the OR gate 43. The logic circuit outputs a signal S6 depending on the variation of the signal "I" from combinations of the signals S1 to S5. The flip flop 44 holds the signal S6 until the next falling of the next frequency dividing pulse FBAK and outputs the arithmetic output signal "oclk".

Operations of the control output arithmetic unit will subsequently be described with reference to FIGS. 10 and 11.

(1) time period (1) ($0 \leq I \leq M-1-V$):
S3="1", the output signal S7 from the NOR-gate 42 is "0", S1="1", the output signal S8 from the inverter 41 is "0", then the output signal S6 from the OR-gate 43 remains "0".

(2) time period (2) (M−V$\leq$I$\leq$M−1):
S1="1", the output signal S8 from the inverter 41 is "0", S3="0", the output signal S5 from the EX-NOR 37 is outputted through the NOR-gate 42, then the output signal S6 from the OR-gate 43 alternately changes between "0" and "1".

(3) time period (3) (M$\leq$I$\leq$M+V):
S3="0", the output signal S8 from the inverter 41 is "0", S3="0", the signal S5 is transmitted through the NOR-gate 42 and inputted as the signal S7 into the OR-gate 43, and S1="0", and S4="0", and the signal S5 is transmitted through the OR-gate 38, the NAND-gate 40 and the inverter 41 and inputted as the signal 88 into the OR-gate 43, then the output signal S6 from the OR-gate 43 alternately changes between "0" and "1".

(4) time period (4) (M+V+1≦I≦2M−1)

S1="0", S4="1", the output signal S8 from the inverter 41 is "1", then the output signal S6 from the OR-gate 43 remains "1".

The phase locked loop circuit is capable of generating a clock signal having a clock frequency varying in triangle waveform, wherein the frequency modulation waveform is decided in accordance with the externally inputted values. This makes it unnecessary to provide a ROM for setting the frequency-dividing rate. This also makes increased the freedom of setting the frequency modulation to the output clock signal.

It is unnecessary that the circuit configuration of the control output arithmetic unit 23 is limited to as illustrated in FIG. 10. Any circuit configurations capable of realizing both the algorithms "A" and "B" are available for the control output arithmetic unit 23. It is possible that "1" and "0" of the control signal PSEL are allocated to the high and low of the frequency dividing rate; so that the first and second time periods correspond to the rising and falling time periods of the modulation waveform. It is also possible that "1" and "0" of the control signal PSEL are allocated to the low and high of the frequency dividing rate, so that the first and second time periods correspond to the falling and rising time periods of the modulation waveform.

The above-described novel phase locked loop circuit has the frequency modulation function in the form of the triangle waveform to the output clock signal without, however, using the ROM, for which reason it is possible to reduce the chip area for accommodating the circuit and also programmably decide the frequency modulation waveform. This means the high freedom of setting the frequency modulation characteristic of the output clock signal.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A phase locked loop circuit comprising:

a frequency divider for frequency-dividing an output signal to generate frequency-divided pulses;

an oscillator for generating said output signal under control to an oscillation frequency by a control voltage obtained from a signal corresponding to a phase difference between said frequency-divided pulses and a reference frequency signal; and a controller for performing such a control that plural kinds of frequency dividing rate are switched to be given to said frequency divider having a predetermined number of said frequency divided pulses, and at a boundary of switching the plural kinds of frequency dividing rate, the plural kinds of frequency dividing rate are given co-existentially to said frequency divider, and further for switching the co-existent plural kinds of the frequency-dividing rate, the next frequency dividing rate is given before a first appearance of a frequency peak in a transitional characteristic of the frequency of the clock signal outputted from the phase locked loop circuit caused by previous setting the frequency-dividing rate, wherein said controller calculates the frequency dividing rate of said frequency divider on the basis of a first signal "I", a second signal "H" and a third signal "V" to generate a frequency dividing rate control signal in accordance with a frequency dividing time period of said output signal and supply said frequency dividing rate control signal to said frequency divider, where said first signal "I" represents a counted value of said frequency-divided pulses, and said second signal "M" represents the number of outputs of said frequency divided pulses corresponding to said frequency dividing time period, and said third signal "V" represents the number of appearance of a combination of first and second frequency dividing rates, and where said first frequency dividing rate is allocated to a first half time period of a first time period corresponding to a rising time period or a falling time period of said frequency modulation waveform, and said second frequency dividing rate is allocated to a second half time period of said first time period, and said first and second frequency dividing rates alternately appear for every frequency dividing time periods at a boundary between said first half time period and said second half time period.

2. The phase locked loop circuit as claimed in claim 1, wherein said controller outputs said first frequency dividing rate if 0≦I≦M−1−V is satisfied in said first half time period of said first time period, wherein if 0≦I≦M−1−V is not satisfied in said first half time period of said first time period, said controller outputs said second frequency dividing rate, provided that M is an even number and both V and I are either one of odd and even numbers, or provided that M is an odd number and V is an odd number and I is an even number, or provided that M is an odd number and V is an even number and I is an odd number, wherein otherwise but in said first half time period of said first time period, said controller outputs said first frequency dividing rate, wherein said controller outputs said second frequency dividing rate if M+V≦I is satisfied in said second half time period of said first time period, wherein if M+V≦I is not satisfied in said second half time period of said first time period, said controller outputs said first frequency dividing rate, provided that M is an even number and V is an odd number and I is an even number, or provided that M is an even number and V is an even number and both V and I are either one of even and odd numbers, and wherein otherwise but in said second half time period of said first time period, said controller outputs said second frequency dividing rate.

3. A phase locked loop circuit comprising:

a frequency divider for frequency-dividing an output signal to generate frequency-divided pulses;

an oscillator for generating said output signal under control to an oscillation frequency by a control voltage obtained from a signal corresponding to a phase difference between said frequency-divided pulses and a reference frequency signal; and a controller for performing such a control that plural kinds of frequency dividing rate are switched to be given to said frequency divider having a predetermined number of said frequency divided pulses, and at a boundary of switching the plural kinds of frequency dividing rate, the plural kinds of frequency dividing rate are given co-existentially to said frequency divider, and further for switching the co-existent plural kinds of the frequency-dividing rate, the next frequency dividing rate is given before a first appearance of a frequency peak in a transitional characteristic of the frequency of the clock signal outputted from the phase locked loop circuit caused by previous setting the frequency-dividing rate, wherein said controller has a control output arithmetic unit which calculates the frequency dividing rate of said frequency divider on the basis of a first signal "I", a second signal "M" and a third signal "V" to generate an arithmetic output signal in accordance with a frequency dividing time period of said output signal, where said first signal "I" represents a counted value of said frequency divided pulses, and said second signal "M" represents the number of outputs of said frequency divided pulses corresponding to said frequency dividing time period, and said third signal "V" represents the number of appearance of a combination of first and second frequency dividing rates, and where said first frequency dividing rate is allocated to a first half time period of a first time period corresponding to first one of a rising time period and a falling time period of said frequency modulation waveform, and said second frequency dividing rate is allocated to a second half time period of said first time period, and said first and second frequency dividing rates alternately appear for every frequency dividing time periods at a boundary between said first half time period and said second half time period, and further wherein said control output arithmetic unit selects said arithmetic output signal in said first time period, and said control output arithmetic unit selects an inverted signal to said arithmetic output signal in a second time period corresponding to second one of said rising time period and said falling time period of said frequency modulation waveform, and said control output arithmetic unit supplies selected one of said arithmetic output signal and said inverted signal to said frequency divider as a frequency dividing rate control signal.

4. The phase locked loop circuit as claimed in claim 3, wherein said control output arithmetic unit outputs said first frequency dividing rate if $0 \leq I \leq M-1-V$ is satisfied in said first half time period of said first time period, wherein if $0 \leq I \leq M-1-V$ is not satisfied in said first half time period of said first time period, said control output arithmetic unit outputs said second frequency dividing rate, provided that M is an even number and both V and I are either one of odd and even numbers, or provided that M is an odd number and V is an odd number and I is an even number, or provided that M is an odd number and V is an even number and I is an odd number, wherein otherwise but in said first half time period of said first time period, said control output arithmetic unit outputs said first frequency dividing rate, wherein said control output arithmetic unit outputs said second frequency dividing rate if $M+V0 \leq I$ is satisfied in said second half time period of said first time period, wherein if $M+V \leq I$ is not satisfied in said second half time period of said first time period, said control output arithmetic unit outputs said first frequency dividing rate, provided that M is an even number and V is an odd number and I is an even number, or provided that M is an even number and V is an even number and both V and I are either one of even and odd number, and wherein otherwise but in said second half time period of said first time period, said control output arithmetic unit outputs said second frequency dividing rate.

5. A method of a frequency modulation to a phase locked loop circuit comprising the steps of:

frequency-dividing an output signal to generate frequency-divided pulses; and generating said output signal under control to an oscillation frequency by a control voltage obtained from a signal corresponding to a phase difference between said frequency-divided pulses and a reference frequency signal, thereby to form a phase locked loop, wherein plural kinds of frequency dividing rate are switched to be given to said frequency divider having a predetermined number of said frequency divided pulses, and at a boundary of switching the plural kinds of frequency dividing rate, the plural kinds of frequency dividing rate are given co-existentially to said frequency divider, and further for switching the co-existent plural kinds of the frequency-dividing rate, the next frequency dividing rate is given before a first appearance of a frequency peak in a transitional characteristic of the frequency of the clock signal outputted from said phase locked loop caused by previous setting the frequency-dividing rate, wherein the frequency dividing rate of said frequency divider is calculated on the basis of a first signal "I", a second signal "M" and a third signal "V" to generate a frequency dividing rate control signal in accordance with a frequency dividing time period of said output signal, where said first signal "I" represents a counted value of said frequency-divided pulses, and said second signal "M" represents the number of outputs of said frequency divided pulses corresponding to said frequency dividing time period, and said third signal "V" represents the number of appearance of a combination of first and second frequency dividing rates, and where said first frequency dividing rate is allocated to a first half time period of a first time period corresponding to a rising time period or a falling time period of said frequency modulation waveform, and said second frequency dividing rate is allocated to a second half time period of said first time period, and said first and second frequency dividing rates alternately appear for every frequency dividing time periods at a boundary between said first half time period and said second half time period.

6. The method as claimed in claim 5, wherein said first frequency dividing rate is outputted if $0 \leq I \leq M-1-V$ is satisfied in said first half time period of said first time period, wherein if $0 \leq I \leq M-1-V$ is not satisfied in said first half time period of said first time period, said second frequency dividing rate is outputted, provided that M is an even number and both V and I are either one of odd and even numbers, or provided that M is an odd number and V is an odd number and I is an even number, or provided that M is an odd number and V is an even number and I is an odd number, wherein otherwise but in said first half time period of said first time period, said first frequency dividing rate is outputted, wherein said second frequency dividing rate is outputted if $M+V \leq I$ is satisfied in said second half time period of said first time period, wherein if M+V≦I is not satisfied in said second half time period of said first time period, said first frequency dividing rate is outputted, provided that M is an even number and V is an odd number and I is an even number, or provided that M is an even number and V is an even number and both V and I are either one of even and odd numbers, and wherein otherwise but in said second half time period of said first time period, said second frequency dividing rate is outputted.

7. A method of a frequency modulation to a phase locked loop circuit comprising the steps of:

frequency-dividing an output signal to generate frequency-divided pulses; and generating said output signal under control to an oscillation frequency by a control voltage obtained from a signal corresponding to a phase difference between said frequency-divided pulses and a reference frequency signal, thereby to form a phase locked loop, wherein plural kinds of frequency dividing rate are switched to be given to said frequency divider having a predetermined number of said frequency divided pulses, and at a boundary of switching the plural kinds of frequency dividing rate, the plural kinds of frequency dividing rate are given co-existentially to said frequency divider, and further for switching the co-existent plural kinds of the frequency-dividing rate, the next frequency dividing rate is given before a first appearance of a frequency peak in a transitional characteristic of the frequency of the clock signal outputted from said phase locked loop caused by previous setting the frequency-dividing rate, wherein the frequency dividing rate is calculated on the basis of a first signal "I", a second signal "M" and a third signal "V" to generate an arithmetic output signal in accordance with a frequency dividing time period of said output signal, where said first signal "I" represents a counted value of said frequency-divided pulses, and said second signal "M" represents the number of outputs of said frequency divided pulses corresponding to said frequency dividing time period, and said third signal "V" represents the number of appearance of a combination of first and second frequency dividing rates, and where said first frequency dividing rate is allocated to a first half time period of a first time period corresponding to first one of a rising time period and a falling time period of said frequency modulation waveform, and said second frequency dividing rate is allocated to a second half time period of said first time period, and said first and second frequency dividing rates alternately appear for every frequency dividing time periods at a boundary between said first half time period and said second half time period, and further wherein said arithmetic output signal is selected in said first time period, and an inverted signal to said arithmetic output signal is selected in a second time period corresponding to second one of said rising time period and said falling time period of said frequency modulation waveform.

8. The method as claimed in claim 7, wherein said first frequency dividing rate is outputted if 0≦I≦M−1−V is satisfied in said first half time period of said first time period, wherein if 0≦I≦M−1−V is not satisfied in said first half time period of said first time period, said second frequency dividing rate is outputted, provided that M is an even number and both V and I are either one of odd and even numbers, or provided that M is an odd number and V is an odd number and I is an even number, or provided that M is an odd number and V is an even number and I is an odd number, wherein otherwise but in said first half time period of said first time period, said first frequency dividing rate is outputted, wherein said second frequency dividing rate is outputted if M+V≦I is satisfied in said second half time period of said first time period, wherein if M+V≦I is not satisfied in said second half time period of said first time period, said first frequency dividing rate is outputted, provided that M is an even number and V is an odd number and I is an even number, or provided that M is an even number and V is an even number and both V and I are either one of even and odd numbers, and wherein otherwise but in said second half time period of said first time period, said second frequency dividing rate is outputted.

* * * * *